FOUR-REGION SWITCHING TRANSISTOR COMPRISING A CONTROLLED CURRENT PATH IN THE EMITTER

Filed Aug. 20, 1962

INVENTOR:
Peter Arthur Turner
By: Pillars and Bowyer
ATTORNEY

United States Patent Office 3,263,139
Patented July 26, 1966

3,263,139

FOUR-REGION SWITCHING TRANSISTOR COMPRISING A CONTROLLED CURRENT PATH IN THE EMITTER

Peter Arthur Turner, Rugby, England, assignor to Associated Electrical Industries Limited, London, England, a British company Filed Aug. 20, 1962, Ser. No. 217,795
Claims priority, application Great Britain, Aug. 29, 1961, 31,072/61
4 Claims. (Cl. 317—235)

This invention relates to controlled rectifiers which employ a semi-coductor P.N.P.N. structure, and is concerned with improving the performance of the rectifier with respect to the minimum switching current which is required to change the structure from its high to its low impedance state. By a semi-conductor P.N.P.N. structure is meant a wafer or body of semi-conductor material provided with four regions having either P or N-type conductivity characteristic and arranged such that three P.N. junctions are formed between said regions.

Controlled rectifiers of a known type employ a wafer of semi-conductor material which provides three of the four regions, and the fourth region, which acts as the emitter, is produced by alloying into the surface of one of the outer regions of the wafer a body of impurity activating characteristic of the opposite conductivity type. The trigger electrode is disposed adjacent the emitter on the same surface of the wafer.

An object of the present invention is to provide a controlled rectifier employing a semi-conductor P.N.P.N. structure in which the current required to change the structure from its high to its low impedance state is lower than that required in similar rectifiers known heretofore.

In accordance with the present invention, the portion of the P.N.P.N. structure which forms the emitter region of a controlled semi-conductor rectifier, is so shaped in the vicinity of the trigger electrode as to provide a finger which extends towards said electrode such that substantially all of tthe current which flows between said electrode and said region passes through said finger.

The emitter region is conveniently formed by a metallic foil, containing the required impurity activating material, which is alloyed into the surface of one of the outer regions of a wafer of semi-conductor material having either P.N.P. or N.P.N. conductivity characteristics. The foil is generally of circular form and is shaped to provide the finger before it is alloyed into the wafer.

The finger may be of triangular form with the base portion of the triangle connected to the main part of the foil and the apex of the triangle, which provides an acute angle, extending towards the trigger electrode. Alternatively, the finger may comprise an enlarged head portion connected to the main part of the foil by a narrow neck.

In order that the invention may be more readily understood it will now be described, by way of example, with reference to the accompanying drawing, in which.

Figure 1:
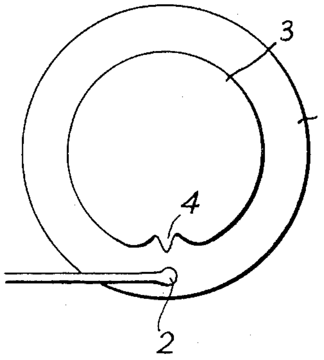
FIG. 1 is a plan view of one embodiment of the invention.

Reference numeral 1 indicates a wafer of semi-conductor material which provides three regions, having alternately P or N-type conductivity characteristic and arranged such that two P.N. junctions are formed between them. The P.N.P.N. structure of the rectifier is produced by alloying into one surface of one of the outer regions of the wafer, a body of impurity activating material characteristic of the opposite conductivity type to form a region which serves as the emitter. The trigger electrode 2 of the controlled rectifier is disposed adjacent the emitter region on the outer surface of the wafer 1.

In the embodiment of the invention shown in FIG. 1, the emitter region is formed by a thin metallic foil 3, conveniently an alloy of gold and antimony, which is alloyed into a surface of an outer region of the wafer having P-type conductivity. A portion of the foil is shaped to provide a finger 4 of generally triangular form. The base of the triangle is secured to the main part of the foil 3, and the acute angled apex of the triangle extends towards the trigger electrode 2 which is located adjacent the emitter. The trigger electrode consists of an aluminium wire in ohmic contact with the wafer 1.

When the foil is melted during the alloying process the molten metal may be withdrawn away from the apex of the finger by the surface tension which is present in the metal. This results in the depth of penetration of the metal, forming the tip of the finger, into the wafer, being reduced.

Figure 2:
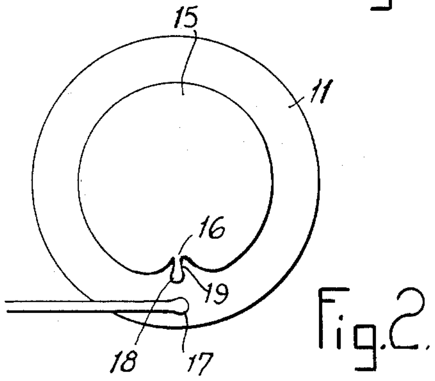
FIG. 2 is a plan view of a further embodiment.
Figure 3:
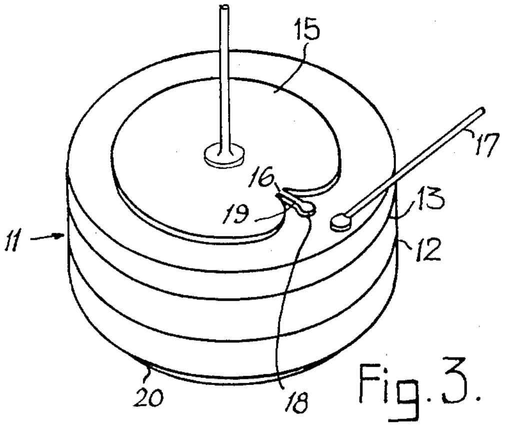
FIG. 3 is a perspective view of the embodiment illustrated in FIG. 2.

The preferred embodiment of the invention shown in FIGS. 2 and 3 overcomes the disadvantage mentioned above. A wafer of semi-conductor material 11 is provided with three regions having alternately P or N conductivity characteristic and arranged such that two P.N. junctions 12 and 13 are formed between them. A foil 15 conveniently an alloy of gold and antimony is provided with a finger 16 which extends towards the trigger electrode 17. The finger is provided with an enlarged head portion 18 connected to the main part of the foil by means of a narrow neck 19. With this arrangement the surface tension is less likely to draw the metal from the enlarged head portion of the finger into the remainder of the foil during the alloying process. An ohmic base contact 20 is provided on the face of the wafer of semi-conductor material which is opposite to that from which the emitter electrode is located.

By shaping the emitter region of a controlled semi-conductor rectifier such that a finger-like portion extends towards the trigger electrode, substantially all of the current which passes between the emitter and trigger electrodes flows through the finger portion of the emitter and a high current density is produced in that portion. When the trigger current is concentrated into a small portion of the emitter, the value of the current to produce the triggering action of the rectifier is lower than that normally required in a semi-conductor controlled rectifier of the same physical dimensions and power rating.

What I claim is:

1. A controlled rectifier comprising a wafer of semi-conductor material having a region of one conductivity characteristic and two end regions of opposite conductivity characteristic with the regions arranged to provide two PN junctions in the wafer, a further region which serves as the emitter region to said rectifier extending over a substantial part of the surface of one of said end regions and forming a PN junction therewith, an electrode in ohmic contact with said further region, a trigger electrode in ohmic contact with said end region and a base electrode in ohmic contact with the surface of the other end region of the wafer, with said further region being shaped to provide a narrow finger which extends towards the trigger electrode and is the part of the region closest thereto, whereby substantially all of the current which flows between said trigger electrode and the further region passes through the PN junction between the finger and the end region.

2. A controlled rectified as claimed in claim 1, in which said finger is of triangular form with the apex of the triangle, which provides an acute angle, extending towards said trigger electrode.

3. A controlled rectifier as claimed in claim 1, in which said finger comprises an enlarged head portion connected to the remainder of said further region by a narrow neck.

4. A controlled rectifier comprising a wafer of semiconductor material having a region of one conductivity characteristic and two end regions of opposite conductivity characteristic with the regions arranged to provide two PN junctions in the wafer, a further region which serves as the emitter region to said rectifier extending over a substantial part of the surface of one of said end regions and forming a PN junction therewith, an electrode in ohmic contact with said further region, a trigger electrode in ohmic contact with said end region and a base electrode in ohmic contact with the surface of the other end region of the wafer, with said further region being of generally circular form with a narrow finger extending outwardly therefrom towards the trigger electrode to provide the part of the region closest thereto, whereby substantially all of the current which flows between said trigger electrode and the further region passes through the PN junction between the finger and the end region.

References Cited by the Examiner

UNITED STATES PATENTS

| | | | |
|---|---|---|---|
| 2,862,115 | 11/1958 | Ross | 317—235 |
| 2,964,689 | 12/1960 | Buscheret | 317—235 |

FOREIGN PATENTS

| | | |
|---|---|---|
| 823,784 | 11/1959 | Great Britain. |

OTHER REFERENCES

IBM Technical Disclosure Bulletin, vol. 2, No. 4, December 1959, pages 81, 82, 83.

JOHN W. HUCKERT, *Primary Examiner.*

J. D. KALLAM, *Assistant Examiner.*